(12) United States Patent
Hu et al.

(10) Patent No.: US 6,734,089 B1
(45) Date of Patent: May 11, 2004

(54) TECHNIQUES FOR IMPROVING WORDLINE FABRICATION OF A MEMORY DEVICE

(76) Inventors: Yongjun Jeff Hu, 2571 S. Culpeper Ave., Boise, ID (US) 83642; Satish Bedge, 5861 S. Schooner Way, Boise, ID (US) 83716-9049; Kevin Torek, 1718 N. Kastle Falls, Meridian, ID (US) 83642

( * ) Notice: Subject to any disclaimer, the term of this patent is extended or adjusted under 35 U.S.C. 154(b) by 0 days.

(21) Appl. No.: 10/345,542

(22) Filed: Jan. 16, 2003

(51) Int. Cl.[7] ............... H01L 21/3205; H01L 21/4763; H01L 21/336
(52) U.S. Cl. ............ 438/585; 438/592; 438/258
(58) Field of Search .............. 438/595, 585, 438/592, 563, 258, 257, 287, 775, 778

(56) References Cited

U.S. PATENT DOCUMENTS

| | | | | |
|---|---|---|---|---|
| 5,541,427 | A | * | 7/1996 | Chappell et al. ............. 257/306 |
| 5,923,999 | A | * | 7/1999 | Balasubramanyam et al. ... 438/592 |
| 6,020,243 | A | * | 2/2000 | Wallace et al. .............. 438/287 |
| 6,215,190 | B1 | * | 4/2001 | Bruce et al. ................ 257/774 |
| 6,239,011 | B1 | * | 5/2001 | Chen et al. .................. 438/595 |
| 6,274,467 | B1 | * | 8/2001 | Gambino et al. ............ 438/563 |
| 6,373,114 | B1 | * | 4/2002 | Jeng et al. ................... 257/413 |
| 6,414,351 | B2 | * | 7/2002 | Clampitt et al. ............. 438/258 |
| 6,423,474 | B1 | * | 7/2002 | Holscher ..................... 430/312 |
| 6,548,357 | B2 | * | 4/2003 | Weybright et al. ........... 438/279 |
| 6,551,878 | B2 | * | 4/2003 | Clampitt et al. ............. 438/258 |
| 6,562,730 | B2 | * | 5/2003 | Jeng ............................ 438/775 |
| 6,589,884 | B1 | * | 7/2003 | Torek ........................... 438/755 |
| 6,617,262 | B2 | * | 9/2003 | Beaman ....................... 438/778 |
| 6,620,714 | B2 | * | 9/2003 | Su et al. ...................... 438/585 |
| 6,627,933 | B2 | * | 9/2003 | Juengling .................... 257/295 |
| 6,645,818 | B1 | * | 11/2003 | Sing et al. .................... 438/275 |
| 6,657,268 | B2 | * | 12/2003 | Besser et al. ................ 438/592 |
| 6,660,588 | B1 | * | 12/2003 | Yang et al. .................. 438/257 |
| 6,660,660 | B2 | * | 12/2003 | Haukka et al. .............. 438/778 |
| 6,664,604 | B1 | * | 12/2003 | Besser et al. ................ 438/737 |
| 6,670,231 | B2 | * | 12/2003 | Powell et al. ................ 438/216 |

* cited by examiner

*Primary Examiner*—John F. Niebling
(74) *Attorney, Agent, or Firm*—Fletcher Yoder

(57) ABSTRACT

Fabrication techniques for making a semiconductor device. More specifically, techniques for fabricating a wordline in a memory device are provided. Specific heat treatments may be added to the process flow to remove or weaken certain layers formed in the wordlines. For instance, an $SiN_x$ layer and a crystallized $W_2N$ layer may form during the fabrication of the wordline. While the layers may provide certain advantages at certain points in the fabrication process, they may be undesirable at subsequent points. One or more anneal processes may be implemented at various points in the processing to eliminate the crystallized $W_2N$ layer and weaken the $SiN_x$ layer.

39 Claims, 6 Drawing Sheets

TECHNIQUES FOR IMPROVING WORDLINE FABRICATION OF A MEMORY DEVICE

BACKGROUND OF THE INVENTION

1. Field of the Invention

The present invention relates generally to a technique for fabricating integrated circuits and, more particularly, to a technique for fabricating wordlines in a memory device.

2. Background of the Related Art

This section is intended to introduce the reader to various aspects of art, which may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled circuits are used in a wide variety of applications throughout the world. Such applications include personal computers, control systems, telephone networks, and a host of other consumer products. A personal computer or control system is made up of various different components that handle different functions for the overall system. By combining these different components, various consumer products and systems are able to meet the specific needs of an end user. As is well known, microprocessors are essentially generic devices that perform specific functions under the control of software programs. These software programs are generally stored in one or more memory devices that are coupled to the microprocessor and/or other peripherals.

The memory devices include many different types of circuits that are typically formed using semiconductor material. These circuits work together to allow the memory device to carry out and control various functions within an electronic device. One type of high-density memory device is a random access memory (RAM) device. The random access memories are complex integrated circuits, which are fabricated using a variety of designs. Despite their complexity, manufacturers typically attempt to design memories that are inexpensive to manufacture, while at the same time maintain high performance and high reliability.

Random access memory devices, such as dynamic random access memory (DRAM) devices and static random access memory (SRAM) devices generally include a number of memory cells arranged in an array of rows and columns. The rows and columns provide signal paths to and from each memory cell in the array. Regardless of whether the device is a DRAM or SRAM, each memory cell generally includes one or more storage devices, such as capacitors, and one or more access devices, such as transistors. The access devices are generally coupled to the rows and columns of the array to provide access to the storage device. As can be appreciated, the rows and columns may also be referred to as wordlines and bitlines.

It may be desirable to fabricate wordlines that have a low resistance, a low stack height, and little or no cross diffusion. Typically, low resistance wordlines are preferred to maximize current flow through the wordlines even at higher frequencies. Wordlines that have high resistances may slow the speed of a semiconductor device. Accordingly, wordlines may be fabricated using highly conductive materials to maintain a relatively low resistance. Wordlines are generally fabricated out of layers of various materials that are patterned to form wordline stacks on a substrate, such as a silicon (Si) substrate. One conventional wordline stack design may include gate oxide, polysilicon, tungsten nitride, and tungsten layers deposited on a silicon (Si) substrate, for example.

Integrated circuits, such as memory devices, which may include wordlines, are typically fabricated on a substrate through any number of manufacturing processes, such as layering, doping, and patterning. Layering generally refers to adding material to the surface of the substrate by a growth process, such as oxidation, or through a deposition process, such as chemical vapor deposition (CVD) or physical vapor deposition (PVD). Doping generally refers to the process of implanting dopants into the substrate surface or overlying layer and may be used to increase the current carrying capacity of a region of the wafer or overlying layer of material. The doping process may be implemented before a layer is formed, between layers, or even after the layer is formed. Generally, the doping process may be accomplished through an ion implantation process, using boron or other similar dopants, or through thermal diffusion, for example.

Patterning refers to a series of steps that result in the removal of selected portions of layers or underlying substrate material. After removal of the selected portions of the layer(s), via a wet or dry etch process, a pattern is left on the substrate surface. The removal of material allows the structure of the device to be formed by providing holes or windows between layers or by removing unwanted layers. Patterning sets the critical dimensions of the integrated circuit structures being fabricated. Disadvantageously, errors in the patterning and removal process may result in changes and failures in the electrical characteristics in the device.

In addition to the layering, doping and patterning processes described above, heat treating or "annealing" is often used to effect certain changes in the properties of the layered materials. The anneal process may be used to improve electrical connections between materials, improve certain performance characteristics, improve reliability, or enhance the yield of a semiconductor device. Typically, the anneal process involves heating the material to a pre-determined temperature and then cooling the material to recrystalize the structure in a more ordered form or to allow impurities to disperse. This heating and cooling of the material may allow the defects that formed in earlier processes to be repaired. During this process, substantial diffusion of the dopants may occur throughout the semiconductor device. With smaller structures being formed in the layered materials, the diffusion of dopants may be undesirable. As can be appreciated, faster heat treatments such as rapid thermal processing (RTP), may be implemented to prevent the diffusion in the anneal process. With RTP, a constant temperature may be uniformly distributed across a patterned material or semiconductor device to allow the layered materials to recrystalize and minimize the diffusion of the dopants. A variety of rapid thermal processes may be used in the process to assist in the formation of the smaller junctions, such as laser annealing, spike annealing, or impulse annealing.

During the fabrication of wordlines, for example, certain reactions may occur between various layers of material. In one exemplary wordline, a $WN_x$ layer may be disposed on a layer of polysilicon. At high processing temperatures, the nitrogen from the $WN_x$ layer may diffuse into the polysilicon layer thereby forming a barrier layer of $SiN_x$ between the $WN_x$ layer and the polysilicon layer. Disadvantageously, the SiN$_x$ layer may increase the resistance and decrease the conductivity through the wordline.

Further, during subsequent processing steps, a tungsten (W) layer and a nitride layer may be disposed over the WN$_x$ layer. Disadvantageously, a crystallized W$_2$N layer may form on top of the SiN$_x$ layer due to the diffusion of nitrogen through the tungsten (W) layer and into the WN$_x$ layer at high temperatures. The excess nitrogen reacts at high temperatures with the amorphous WN$_x$ layer and forms a dense crystallized W$_2$N layer. Disadvantageously, this W$_2$N layer is difficult to etch and thus may cause problems in fabricating the wordlines.

Further, the dense crystallized W$_2$N layer may inhibit the formation of desirable layers, by blocking the diffusion of one material into another. For instance, the W$_2$N layer may disadvantageously prevent the formation of a titanium silicide (TiSi$_x$) layer after titanium (Ti) is deposited on the wordline during downstream fabrication. The TiSi$_x$ layer may be desirable to reduce the resistance through the wordline and increase the ohmic contact between the metal layers and the polysilicon layer. Accordingly, the W$_2$N layer may be disadvantageous, because it may prevent the formation of the TiSi$_x$ layer.

BRIEF DESCRIPTION OF THE DRAWINGS

Advantages of the invention may become apparent upon reading the following detailed description and upon reference to the drawings in which.

DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
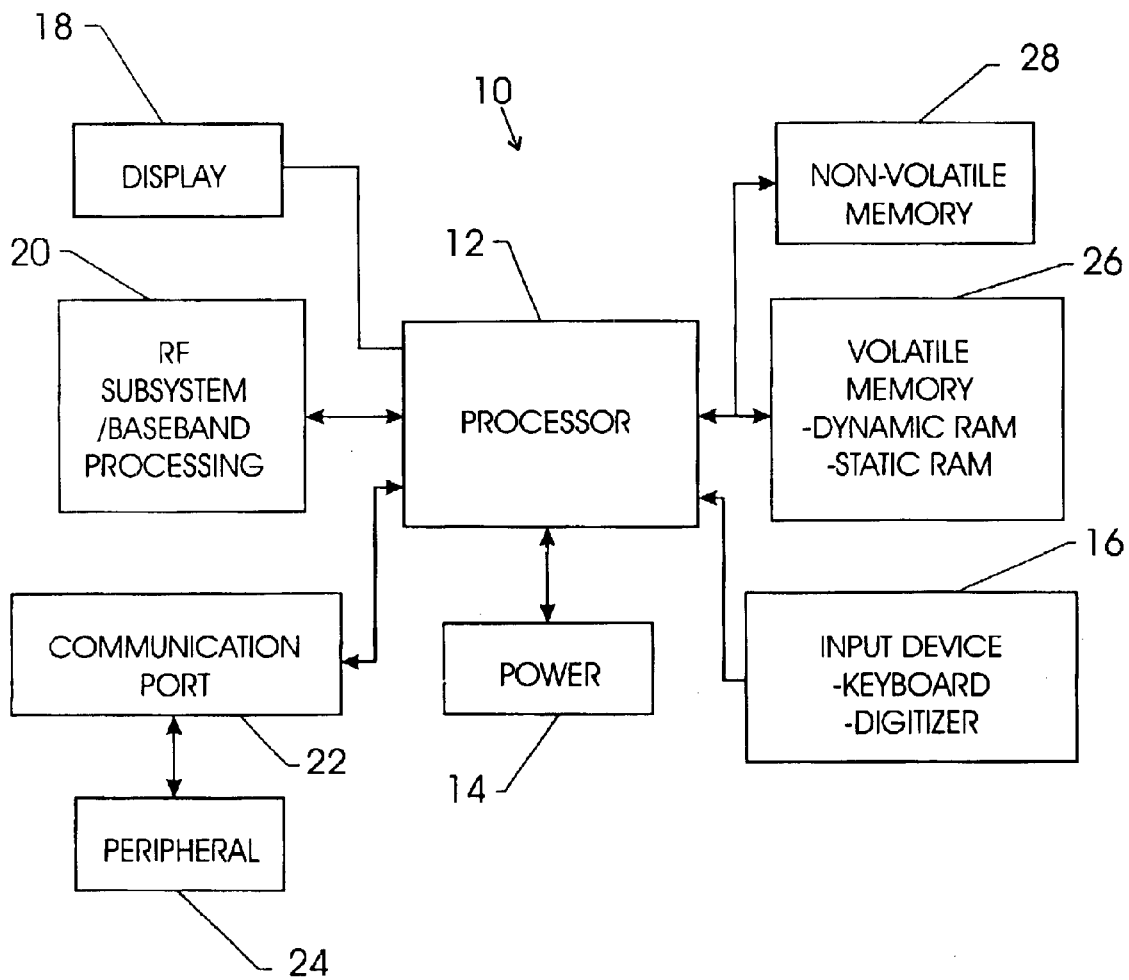
FIG. 1 illustrates a block diagram of an exemplary processor-based device.

Turning now to the drawings, and referring initially to FIG. 1, a block diagram depicting an exemplary processor-based system, generally designated by reference numeral 10, is illustrated. The system 10 may be any of a variety of types such as a computer, pager, cellular phone, personal organizer, control circuit, etc. In a typical processor-based device, a processor 12, such as a microprocessor, controls the processing of system functions and requests in the system 10. Further, the processor 12 may comprise a plurality of processors that share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance.

Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example.

Furthermore, an RF sub-system/baseband processor 20 may also be couple to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs, memory is used to enable the processor 12 to be efficient. Generally, the memory is coupled to the processor 12 to store and facilitate execution of various programs. For instance, the processor 12 may be coupled to the volatile memory 26 which may include Dynamic Random Access Memory (DRAM) and/or Static Random Access Memory (SRAM). The processor 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. The volatile memory 26 on the other hand, is typically quite large so that it can store dynamically loaded applications and data. Additionally, the non-volatile memory 28 may include a high capacity memory such as a tape or disk drive memory.

Figure 2:
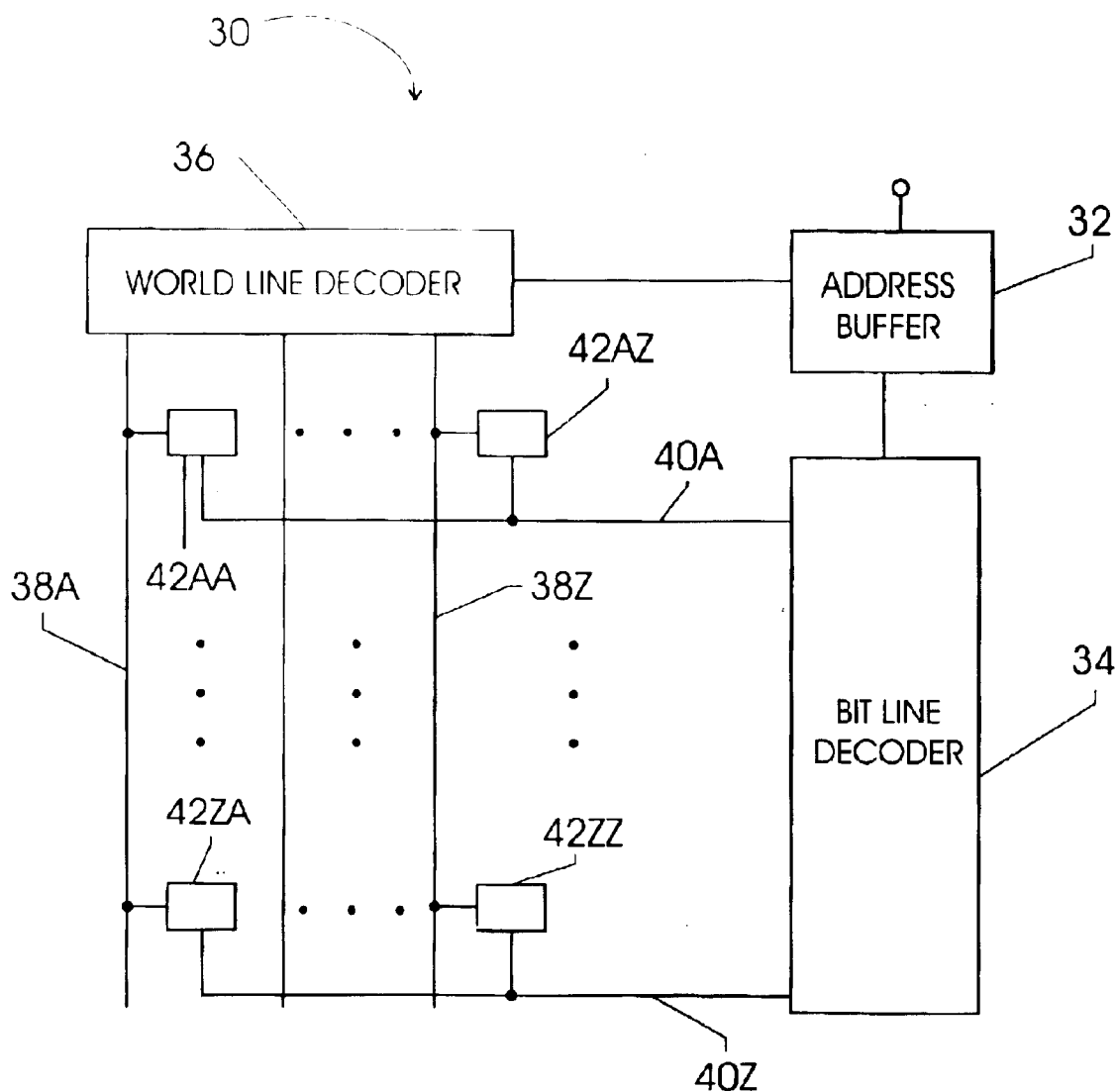
FIG. 2 illustrates a block diagram of an exemplary memory array that may be fabricated in accordance with the present techniques.

As previously described, the volatile memory 26 may include a number of DRAM devices. FIG. 2 is a block diagram illustrating a portion of a DRAM memory array 30 which may be fabricated in accordance with the present techniques. An address buffer 32 is configured to receive address signals. The address buffer 32 is electrically coupled to a bitline decoder 34 and a wordline decoder 36. The bitline decoder 34 and wordline decoder 36 selectively access individual cells in the memory array 30 through conductive rows and columns. Accordingly, the wordlines 38A–38Z connect the wordline decoder 36 to each of the memory cells 42AA–42ZZ. Likewise, each of the bitlines 40A–40Z is connected to the bitline decoder 34 and to each of the memory cells 42AA–42ZZ.

The wordline decoder 36 is used to enable the reading or writing of information into one of the memory cells 42AA–42ZZ. The bitline decoder 34 is used to input the information into one of the memory cells 42AA–42ZZ or to read the information out of one of the memory cells 42AA–42ZZ. In one exemplary mode of operation, the memory array 30 receives an address of a particular memory cell 42 at the address buffer 32. The address buffer 32 identifies one of the wordlines 38 of the particular memory cell 42 corresponding to the requested address and passes the address to the wordline decoder 36. The wordline decoder 36 selectively activates the particular wordline 38 to activate an access device in each memory cell 42 that is connected to the selected wordline 38. The bitline decoder 34 selects the bitline (or bitlines) 40 of the memory cell 42 corresponding to the requested address. For a write operation, data received by input/output circuitry is coupled to the selected bitline (or bitlines) 40 and provides for the charge or discharge of a storage device in the selected memory cell 42 through the access device. The charge corresponds to binary data, as can be appreciated by those skilled in the art. For a read operation, data stored in the selected memory cell 42, represented by the charge stored in the storage device, is coupled to the selected bitline (or bitlines) 40, amplified by sense amplifiers in the bitline decoder 34, and a corresponding voltage level is provided to an input/output circuit in the bitline decoder 34.

Figure 3:
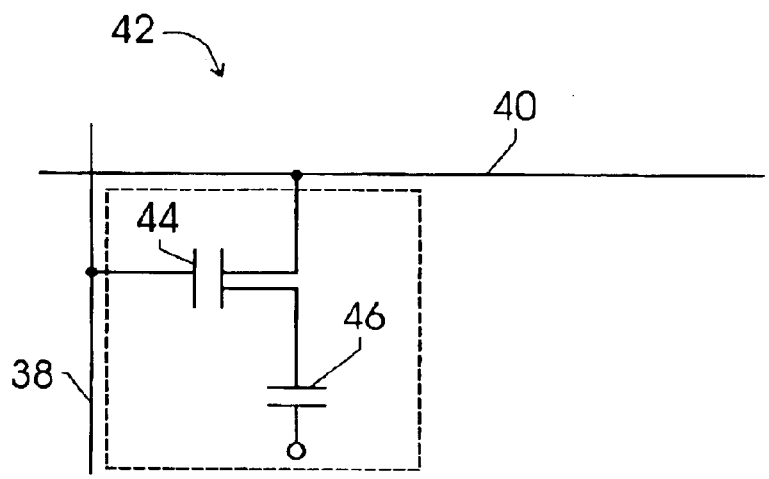
FIG. 3 illustrates a general schematic diagram of an exemplary memory cell of the memory array illustrated in FIG. 2.

FIG. 3 illustrates one exemplary embodiment of a memory cell 42, such as a dynamic random access memory (DRAM) cell. As previously described, the memory cell 42 may include an access device, such as a transistor 44, and a storage device, such as a capacitor 46. The transistor 44 in the memory cell 42 may be a metal-oxide-semiconductor field effect transistor (MOSFET), complementary metal-oxide-semiconductor transistor (CMOS), or any other suitable transistor. Likewise, the transistor 44 may be an n-channel or a p-channel, depending on the specific design.

A first terminal of the transistor 44 is connected to a first terminal of a capacitor 46. The first terminal may be the source or drain of the transistor 44 depending on the mode of operation of the memory cell 42. A second terminal of the transistor 44 may be connected to a bitline 40. The second terminal of the transistor 44 may be the other of the source or drain of the transistor 44, depending on the mode of operation of the memory cell 42. The third terminal or gate of the transistor 44 may be coupled to a wordline 38. The second terminal of the capacitor 46 is connected to ground or a node having a lower potential.

As previously described, to store a charge in the memory cell 42, a first voltage is applied through the wordline 38 to the gate of the transistor 44. The first voltage that is applied to the gate of the transistor 44 opens the transistor 44 to allow a second voltage on the bitline 40 to flow to the capacitor 46. The first and second voltages may be a positive or negative voltage depending on the specific design. Thus, the capacitor 46 stores the charge that was applied to the bitline 40, as can be appreciated by those skilled in the art.

Figure 4:
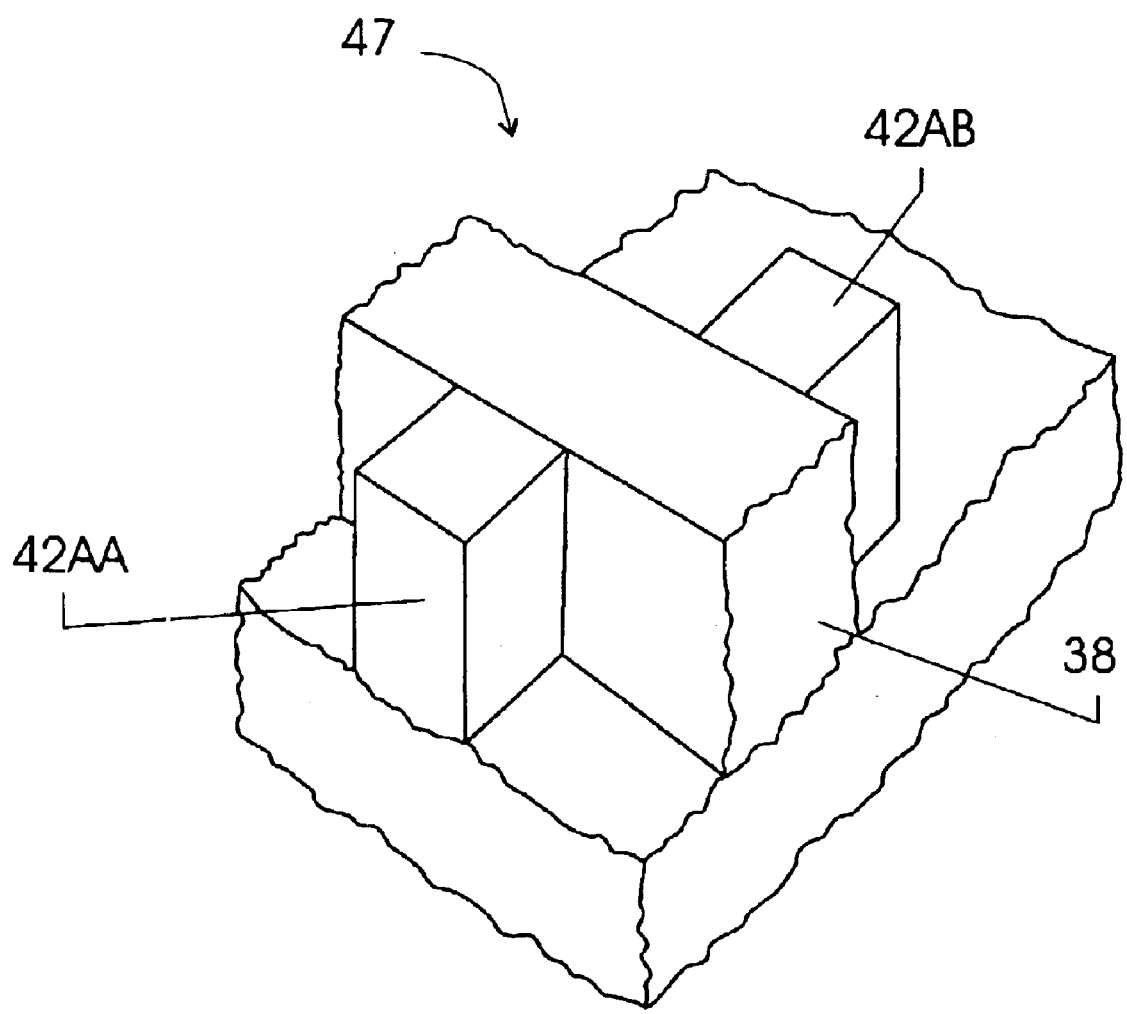
FIG. 4 illustrates an alternative view of a partial memory array with a wordline and memory cells that may be fabricated in accordance with the present techniques.

A top perspective view of a simplified portion of the memory array 30 is illustrated in FIG. 4 and generally indicated by reference numeral 47. The partial memory array 47 includes the wordline 38 coupled between two memory cells 42AA–42AB. As can be appreciated by those skilled in the art, the memory cells 42AA–42AB may be formed by implementing any one of a number of different fabrication methods. The wordline 38 may be fabricated in accordance with the techniques described herein. Furthermore, this embodiment merely illustrates one possible exemplary embodiment of the partial memory array 47. The wordline 38 may include a stack of conductive materials such as tungsten or titanium, for example, which may be disposed over a layer of polysilicon. The memory cells 42AA–42AB and the wordline 38 may be fabricated on a substrate 48, such as a silicon (Si) wafer, for example. However, the substrate 48 may comprise any acceptable material or materials on which the memory cell 42 and wordline 38 may be fabricated. Further, the memory cells 42AA–42AB may be fabricated below the surface of the substrate 48, for example.

Figure 7:
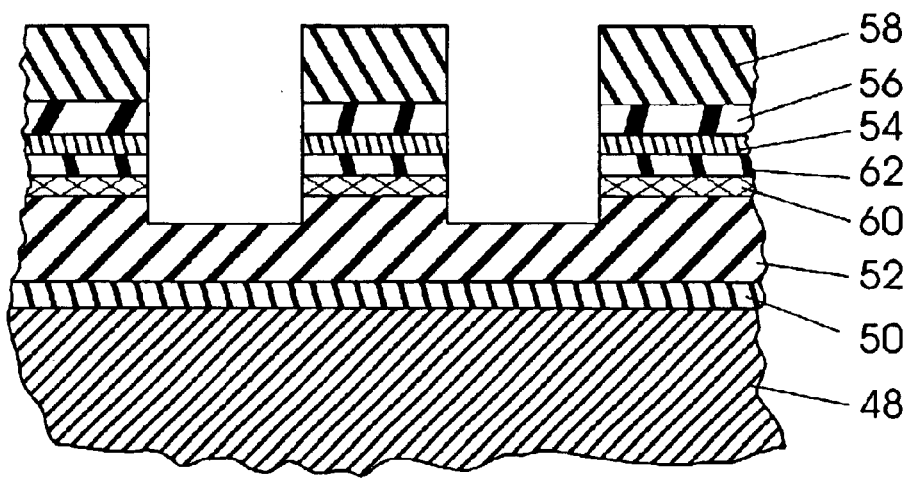
Figure 8:
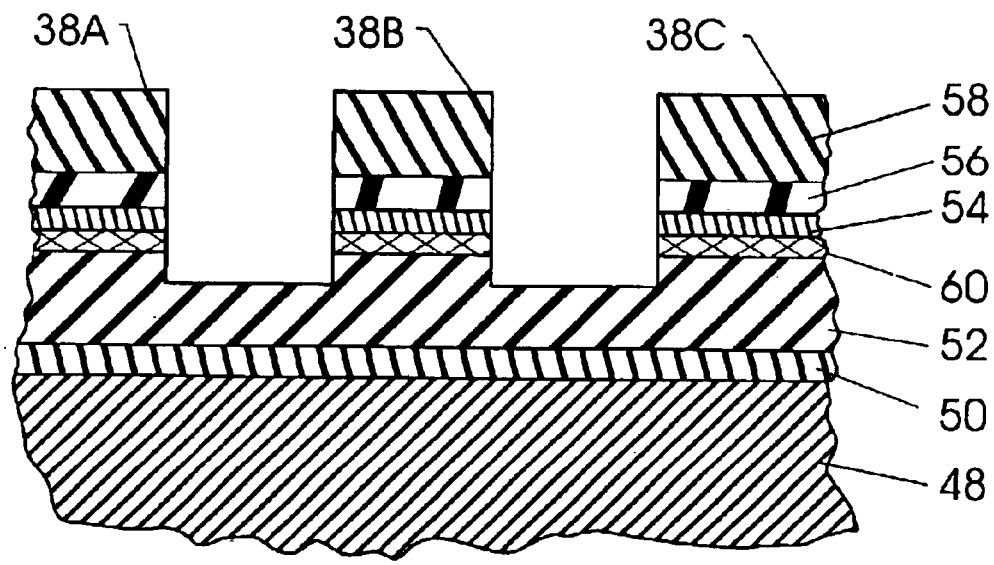
Figure 9:
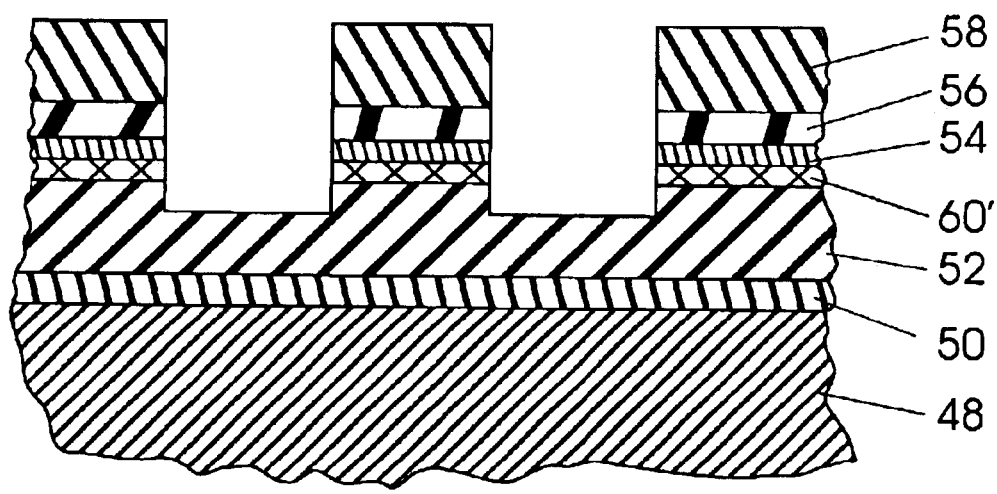
Figure 10:
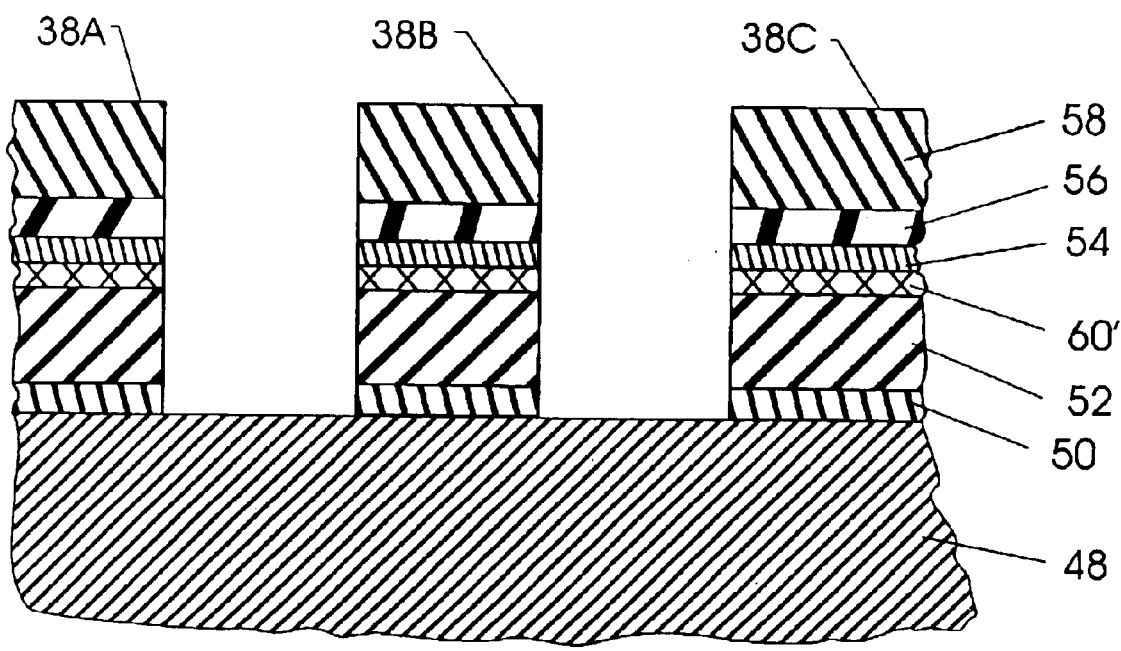

FIGS. 5–8 illustrate an exemplary technique for fabricating a wordline 38. The exemplary technique described with reference to FIGS. 5–8 implements two additional anneal steps for aiding in the fabrication of the wordline 38. As will be evident from the description below, various alternatives to the process described with respect to FIGS. 5–8 may be implemented. Alternative process flows are illustrated in FIGS. 9–11, as further described below.

Figure 5:
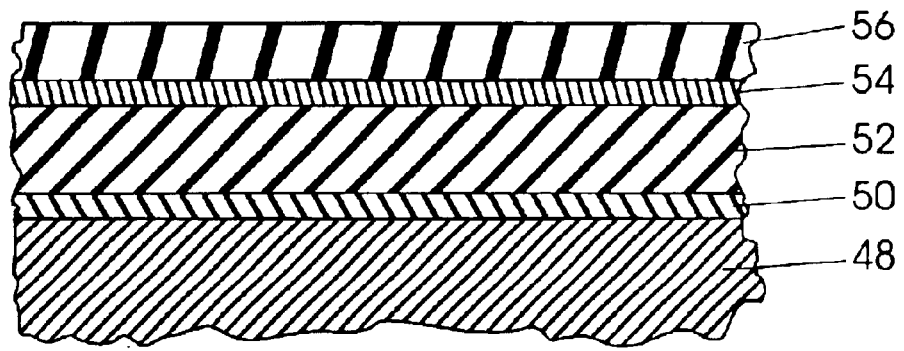
FIGS. 5–10 illustrate cross-sectional views of a wordline during various fabrication process stages in accordance a first embodiment of the present techniques.

Turning now to a first exemplary method for fabricating a wordline 38 in accordance with the present techniques, FIG. 5 illustrates a cross-sectional view of a portion of a wordline 38 to illustrate an exemplary method of fabricating the wordline 38 in accordance with the present techniques. In one exemplary embodiment, a substrate 48, such as a N-channel silicon (Si) substrate, is provided to form the base of the memory device on which the wordline 38 may be fabricated. The substrate 48 may include a number of doped/active regions (not shown) formed by a suitable doping technique such as ion implantation, as can be appreciated by those skilled in the art. The doped regions may form the source (or drain, depending on mode of operation) of the transistor 44 (FIG. 3), as can be appreciated by those skilled in the art. The substrate 48 may include a silicon (Si) wafer. However, the substrate 48 may also include a wafer having a number of layers disposed thereon such that the processing described hereinafter actually occurs over the surface of the layers already disposed on the wafer and having a semiconductive layer, such as silicon (Si), on top, as can be appreciated by those skilled in the art.

FIG. 5 also includes an oxide layer 50, such as silicon dioxide ($SiO_2$), which has been applied on top of the surface of the substrate 48 by wet or dry oxidation of the semiconductor substrate 48, for instance. The oxide layer 50 may be grown on the surface of the wafer by placing the substrate 48 in a heated chamber and exposing the wafer to oxygen gas, as can be appreciated by those skilled in the art. Alternatively, the oxide layer 50 may be deposited over the substrate 48. The oxide layer 50 is generally a thin layer that forms the gate oxide of the transistor 44.

Typically, each wordline 38 further comprises a plurality of layers, which form a wordline stack. In the present exemplary embodiment, the wordline stack generally includes a doped semiconductor layer, a conductive layer, and a cap. Here, the doped semiconductor layer comprises a polysilicon layer 52. The polysilicon layer 52 may be disposed onto the oxide layer 50 through chemical vapor deposition (CVD), for example. The conductive layer may comprise one or more metal layers, such as a tungsten (W) layer 56, and a barrier layer, such as a tungsten nitride ($WN_x$) layer 54. The tungsten (W) layer 56 may be disposed by physical vapor deposition (PVD) or chemical vapor deposition (CVD), for example. The purpose of the tungsten nitride ($WN_x$) layer 54 is described further below.

During fabrication of the memory array, portions of the conductive layer, here tungsten (W) layer 56, may diffuse into the polysilicon layer 52, thereby damaging the polysilicon layer 52. To prevent the diffusion of the tungsten (W)

layer 56 into the polysilicon layer 52, a barrier layer, such as the tungsten nitride (WN$_x$) layer 54, may be disposed between the polysilicon layer 52 and the tungsten (W) layer 56. The tungsten nitride (WN$_x$) layer 54 inhibits the diffusion of the tungsten (W) layer 56 into the polysilicon layer 52 and protects the polysilicon layer 52 during further processing, as can be appreciated by those skilled in the art. Advantageously, the tungsten nitride layer (WN$_x$) 54 provides good electrical conductivity between the tungsten (W) layer 56 and the polysilicon layer 52. The tungsten nitride (WN$_x$) layer 54 may be deposited by physical vapor deposition (PVD) or by chemical vapor deposition (CVD), for example.

Figure 6:
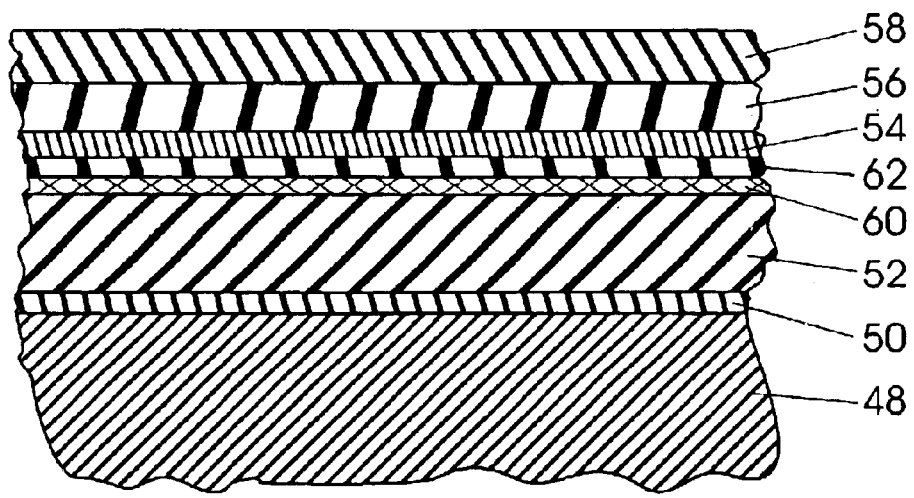

The wordline stack may also include a cap, here a nitride layer 58, such as Si$_3$N$_4$, that is deposited onto the tungsten layer 56, as illustrated in FIG. 6. The nitride layer 58 may be deposited to protect the underlying materials during further processing. As can be appreciated, the cap may comprise various other common insulating materials such as silicon oxide (SiO$_2$), which may be in combination with the nitride layer 58. The nitride layer 58 may be deposited by chemical vapor deposition (CVD), for example. More specifically, the nitride layer 58 may be disposed using a low pressure chemical vapor deposition (LPCVD).

During the fabrication and deposition steps described above, the substrate 48 may receive one or more heat treatments or "anneals." A byproduct of the high temperature heat treatments may be the formation of additional layers from diffusion of the materials in the layers of the wordline 38 into adjacent layers. For instance, a silicon nitride (SiN$_x$ layer 60 may form between the polysilicon layer 52 and the tungsten nitride (WN$_x$) layer 54, as illustrated in FIG. 6. The silicon nitride (SiN$_x$) layer 60 may form during an anneal at a temperature greater than 650° C. at some point after the tungsten nitride (WN$_x$) has been disposed, for example. During the anneal, nitrogen from the tungsten nitride (WN$_x$) layer 54 diffuses into the polysilicon layer 52, thereby forming a silicon nitride (SiN$_x$)layer 60. Advantageously, the silicon nitride (SiN$_x$) layer 60 provides a smooth interface between the polysilicon layer 52 and the layers deposited on the polysilicon layer 52. The smooth interface between the polysilicon layer 52 and the layers above may be advantageous during subsequent etching of the wordlines 38. As can be appreciated, if the surface of the polysilicon layer 52 is rough or non-uniform, the time it takes to etch through the surface of the polysilicon layer 52 will disadvantageously vary from area to area. Further, the silicon nitride (SiN$_x$) layer 60 prevents this roughness from evolving due to the migration of tungsten into the underlying polysilicon layer 52. While the silicon nitride (SiN$_x$) layer 60 may be desirable during the first step of the etch process to form the wordline stacks, as further described below, the silicon nitride (SiN$_x$) layer 60 may be ultimately undesirable since it forms a dielectric between the polysilicon layer 52 and the conductive layer (tungsten layer 56 and tungsten nitride layer 54), thereby reducing conductivity of the wordline 38.

Similarly, during the fabrication and deposition steps described above and/or during one of the intermediate heat treatments, nitrogen may diffuse from the amorphous tungsten nitride layer 54 (and the nitride layer 58 through the tungsten layer 56) and form a dense crystallized W$_2$N layer 62 between the silicon nitride layer 60 and the tungsten nitride layer 54, as illustrated in FIG. 6. The crystallized W$_2$N layer 62 may form during a deposition step or an anneal step performed at a temperature greater than about 650° C. at some point during or after the deposition of the tungsten nitride layer 54 or the nitride layer 58, for example.

For example, the nitride layer 58 may be disposed at a temperature of greater than about 650° C. during an NH$_3$-based LPCVD process. During the deposition (or subsequent anneal), nitrogen may diffuse from the nitride layer 58 through the tungsten layer 56 into the amorphous tungsten nitride layer 54, thereby forming a dense crystallized W$_2$N layer 62. Alternatively, the crystallized W$_2$N layer 62 may form due to excess nitrogen diffusion and crystallization from part of the amorphous tungsten nitride layer 54 at high processing temperatures. As can be appreciated, the nitrogen diffusion into the tungsten nitride layer 54 may result in the complete transformation of the tungsten nitride layer 54 into the dense crystallized W$_2$N layer 62, thereby eliminating the tungsten nitride layer 54, entirely.

The formation of the dense crystallized W$_2$N layer 62 is disadvantageous, because it may be difficult to etch. Further the formation of the dense crystallized W$_2$N layer 62 may hinder other subsequent processes, such titanium suicide formation, for example. During the etching of the wordlines 38, a typical etchant may not remove the crystallized W$_2$N layer 62, while a stronger etchant may result in the over-etching of certain areas thereby forming pits within the device. One etchant that may be used, to etch the W$_2$N layer 62 is CF$_4$. However, as previously described, the CF$_4$ etchant may cause damage to the other layers of the wordline 38. For stages of the fabrication where critical dimensions of etched areas are small, the stronger etchants may damage contact areas, as further described below.

Furthermore, the formation of a crystallized W$_2$N layer 62 may hinder subsequent processes used in the formation of the device. Once the wordline stacks 38A–C (illustrated in FIG. 7 and discussed further below) are formed, a number of dielectric layers (not shown), such as BSPG layers, may be disposed over the wordline stacks 38A–C, thereby burying the wordlines 38, and metal trace layers (not shown) may be formed on the surface of the dielectric layers. To provide electrical contact from the metal traces to the underlying wordlines 38 to route electrical signals to and from the wordlines 38, tungsten posts (not shown) may be implemented. Essentially, contact holes are formed from the metal traces through the underlying dielectric layers, through the nitride layer 58, and to the tungsten (W) layer 56 of the wordline 38. The formation of the contact holes may include multiple etch steps. For instance, one or more etch steps, such as a dry etches, may be implemented to etch through the dielectric layers, including the nitride layer 58. Subsequently, another etch step, such as a wet punch etch, may be implemented to etch into the tungsten layer 56.

The contact holes may be filled with a conductive material, such as tungsten, to provide a conductive path from the metal traces to the wordline 38. Titanium (Ti) (not shown) may be disposed into the contact holes to improve the conductivity between the tungsten posts and the underlying wordlines 38. Upon deposition of the titanium into the contact holes, a titanium silicide (TiSi$_x$) layer (not shown) may be formed between the polysilicon layer 52 and the tungsten posts which may advantageously reduce the resistance through the wordline 38 and increase the ohmic contact between the layers. The TiSi$_x$ layer may be formed during an anneal process that causes diffusion of the titanium (Ti), thereby causing a reaction and combination with the silicon. Disadvantageously, the formation of the dense crystallized W$_2$N layer 62 may prevent the formation of the TiSi$_x$ layer by inhibiting the diffusion of the titanium (Ti) into the silicon (Si) if the W$_2$N layer 62 is not removed before the Ti deposition.

As discussed above, the crystalline W$_2$N layer 62 may be undesirable because it is difficult to etch and hinders other processes, such as the formation of titanium silicide (TiSi$_x$). An anneal process may be implemented to reduce or eliminate the crystalline W$_2$N layer 62. By using an anneal technique described below, the crystalline W$_2$N layer 62 may be eliminated. The heat treatment may convert the W$_2$N layer 62 back into the tungsten (W) layer 56. Further, the heat treatment may remove the amorphous tungsten nitride (WN$_x$ layer 54, as well. Because the silicon nitride layer 60 has been formed and provides a barrier to prevent the migration of the tungsten layer 56 into the polysilicon layer 52, removal of the amorphous tungsten nitride layer 54 may be acceptable.

Referring now, to FIG. 7, a two-step etch process may be used to from the wordline stacks 38A–C. FIG. 7 illustrates the structure of FIG. 6, after the first step of a two-step etch process has been implemented. A photoresist (not shown) may be disposed onto the surface of the nitride layer 58, patterned, exposed and developed to provide wordline stack areas that are masked by the photoresist. The remaining areas not masked by the photoresist are then etched. The structure is etched through the nitride layer 58, the tungsten (W) layer 56, the tungsten nitride layer 54, the silicon nitride (SiN$_x$) layer 60, and partially into the polysilicon layer 52. It should be understood that those skilled in the art readily understand the deposition, masking and etching techniques used to construct the structure illustrated in FIG. 7. Further, it should be noted that because the etching of the wordline stacks 38A–C is relatively unrestricted by etch geometries, etching through the W$_2$N layer 62 at this point in the processing is not difficult. The difficulties in etching the W$_2$N layer 62 are encountered in the formation of the contact openings for the tungsten posts, as described above.

To reduce or eliminate the disadvantageous W$_2$N layer 62, a first additional rapid thermal anneal process (RTP) may be implemented before the completion of the etching of the wordline 38. One specific embodiment for the first additional RTP process that may be used to essentially eliminate the W$_2$N layer 62 is to heat the structure to a temperature of approximately 900° C. for a time in the range of approximately 40 seconds to 120 seconds in an argon/hydrogen vapor (Ar/H$_2$). While this technique advantageously eliminates the W$_2$N layer 62, it may not substantially affect the silicon nitride layer 60. By implementing this first additional anneal process, the W$_2$N layer 62 may be eliminated. Advantageously, implementing the first additional anneal procedure after partially etching the wordlines 38 provides protection for the underlying oxide layer 50, during the added anneal process. Further, by disposing the nitride layer 58 before performing the added anneal process, the underlying tungsten (W) layer 56 is protected from pitting. After the first partial etch of the wordline stacks 38A–C to the polysilicon layer 52 and the 900° C. anneal for approximately 40 seconds to 120 seconds, the W$_2$N layer 62 is advantageously eliminated, as illustrated in FIG. 8. Further, the first additional heat treatment may remove the amorphous tungsten nitride (WN$_x$) layer 54, as well. Because the silicon nitride layer 60 has been formed and provides a barrier to prevent the migration of the tungsten layer 56 into the polysilicon layer 52, removal of the amorphous tungsten nitride layer 54 may be acceptable.

Alternatively, the first additional anneal process may be performed downstream. For instance, the first additional anneal process may be implemented during the formation of the tungsten posts (described above). In one alternate exemplary embodiment, the heat treatment at a temperature of approximately 900° C. for a time in the range of approximately 40 seconds to 120 seconds in an argon/hydrogen vapor (Ar/H$_2$) may be implemented after the etching through the dielectric layers, including the nitride layer 58. The first additional anneal step may be performed before the partial tungsten wet etch, for example.

Further, an alternate or second additional anneal step may be implemented in addition to or instead of the first additional anneal process described above. As previously discussed, while the silicon nitride layer 60 may be desirable to provide uniformly etched wordlines, and to prevent the migration of the tungsten layer 56 into the polysilicon layer 52, the silicon nitride layer 60 may be ultimately undesirable since it forms a dielectric between the polysilicon layer 52 and the tungsten nitride layer 54, thereby reducing conductivity of the wordline stacks 38A–C. To reduce the barrier or insulative effects of the silicon nitride layer 60, a second additional anneal technique may be implemented to weaken or break-up the silicon nitride layer 60. By implementing the second anneal technique, the silicon nitride layer 60 is weakened and the resistivity through the silicon nitride layer 60 may be advantageously reduced. Further, the W$_2$N layer 62 may be advantageously eliminated.

The second additional rapid thermal anneal process (RTP) may be implemented after the first partial etch to effect the desired changes in the wordlines 38. By implementing the second additional RTP process alone (that is to say without also implementing the first additional anneal process described above), the silicon nitride (SiN$_x$ layer 60 may be substantially weakened, but not eliminated, and the W$_2$N layer 62 may be advantageously eliminated. One specific embodiment for the second additional RTP process that may be used to advantageously weaken the silicon nitride (SiN$_x$) layer 60 is to heat the structure to a temperature of around 950° C. for approximately 20 seconds or longer in an argon/hydrogen vapor (Ar/H$_2$). Advantageously, this particular anneal results in the formation of a weakened SiN$_x$ layer 60' and the elimination of the W$_2$N layer 62, as illustrated in FIG. 9. Further, as with the first additional heat treatment, the second additional heat treatment may remove the amorphous tungsten nitride (WN$_x$) layer 54. Because the silicon nitride layer 60 has been formed and provides a barrier to prevent the migration of the tungsten layer 56 into the polysilicon layer 52, removal of the amorphous tungsten nitride layer 54 may be acceptable.

Finally, a second etch is performed to complete each wordline 38, as illustrated in FIG. 10. The second etch isolates each of the wordlines 38A–38C with respect to each other by etching down to the substrate 48, thereby enabling the use of the wordlines 38 in the memory array, as discussed with respect to FIG. 2, above. It should be understood that those skilled in the art readily understand the deposition, masking, and etching techniques used to implement to the second etch. As can also be appreciated by those skilled in the art, a nitride layer (not shown) may be disposed on the structure illustrated with reference to FIGS. 8 or 9 before the second (final) etch. The nitride layer may comprise Si$_3$N$_4$, for example, and may be disposed after the first (partial) etch and etched to form sidewall spacers to protect the tungsten layer 56 from oxidizing during the additional processing of the substrate 48. Subsequently, conventional processing steps may be implemented to form metal interconnect patterns, alloying and finally passivation layers and bond pad pattern etching to complete the memory array, as can be appreciated by those skilled in the art.

As can be appreciated, the additional anneal processes described herein may be implemented in a variety of different ways. One or both of the additional anneals may be implemented during the fabrication of a wordline 38, as described above. Further, one or both of the additional anneal processes may be implemented after a first partial etch of the wordline stacks 38A–38C, as described above, or at various stages in the downstream process flow, such as during the formation of the tungsten posts.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of fabricating a wordline comprising the acts of:
   (a) providing a first dielectric layer over a substrate;
   (b) disposing a polysilicon layer over the dielectric layer;
   (c) disposing a barrier layer over the polysilicon layer;
   (d) disposing a conductive layer over the barrier layer;
   (e) disposing a nitride layer over the conductive layer;
   (f) forming a first intermediate layer between the barrier layer and the polysilicon layer;
   (g) forming a second intermediate layer between the barrier layer and the first intermediate layer;
   (h) etching through each of the nitride layer, the conductive layer, the second intermediate layer, the first intermediate layer and partially through the polysilicon layer to form wordline stacks;
   (i) annealing the substrate to eliminate the second intermediate layer; and
   (j) etching the wordline through the remainder of the polysilicon layer.

2. The method, as set forth in claim 1, wherein act (a) comprises the act of disposing an oxide layer.

3. The method, as set forth in claim 1, wherein act (c) comprises the act of disposing an amorphous tungsten nitride ($WN_x$) layer.

4. The method, as set forth in claim 3, wherein act (d) comprises the act of disposing a tungsten (W) layer over the amorphous tungsten nitride layer.

5. The method, as set forth in claim 4, wherein act (f) comprises the act of forming a silicon nitride layer ($Si_x$) between the amorphous tungsten nitride layer and the polysilicon layer.

6. The method, as set forth in claim 5, wherein act (g) comprises the act of forming a crystallized tungsten nitride ($W_2N$) layer between the amorphous tungsten nitride layer and the silicon nitride layer.

7. The method, as set forth in claim 5, wherein act (i) comprises the act of annealing the substrate in an $Ar/H_2$ gas at a temperature of 900° C. for a time period of between about 40 seconds and about 120 seconds.

8. The method, as set forth in claim 5, wherein act (i) comprises the act of annealing the substrate to eliminate the second intermediate layer and to eliminate the barrier layer.

9. The method, as set forth in claim 8, wherein act (i) comprises the act of annealing the substrate in an $Ar/H_2$ gas at a temperature of 950° C. for a time period of greater than or equal to about 20 seconds.

10. The method, as set forth in claim 9, wherein act (i) comprises the act of annealing the substrate to increase the conductivity of the silicon nitride layer.

11. The method, as set forth in claim 1, wherein act (i) comprises the acts of:
   annealing the substrate in an $Ar/H_2$ gas at a temperature of 900° C. for a time period of between about 40 seconds and about 120 seconds; and
   annealing the substrate in an $Ar/H_2$ gas at a temperature of 950° C. for a time period of greater than or equal to about 20 seconds.

12. A method of fabricating a wordline stack, the wordline stack comprising an amorphous tungsten nitride layer disposed over a polysilicon layer and having a silicon nitride layer and a crystallized tungsten nitride layer formed there between comprising the acts of:
   (a) heating the wordline stack to remove the crystallized tungsten nitride layer; and
   (b) heating the wordline stack to increase the conductivity of the silicon nitride layer.

13. The method, as set forth in claim 12, wherein act (a) comprises the act of annealing the wordline stack in an $Ar/H_2$ gas at a temperature of 900° C. for a time period of between about 40 seconds and about 120 seconds.

14. The method, as set forth in claim 12, wherein act (b) comprises the act of annealing the wordline stack in an $Ar/H_2$ gas at a temperature of 950° C. for a time period of greater than or equal to about 20 seconds.

15. The method, as set forth in claim 12, wherein act (b) is performed prior to act (a).

16. The method, as set forth in claim 12, wherein the wordline stack is partially etched through the polysilicon layer before performing acts (a) and (b).

17. A method of fabricating a wordline, comprising the acts of:
   (a) disposing a semiconductor layer over a substrate;
   (b) disposing a metal-nitride layer over the semiconductor layer;
   (c) forming a first barrier layer between the semiconductor layer and the metal-nitride layer;
   (d) forming a second barrier layer between the first barrier layer and the metal-nitride layer; and
   (e) heating the substrate to remove the second barrier layer.

18. The method, as set forth in claim 17, wherein act (a) comprises the act of disposing a polysilicon layer over the substrate.

19. The method, as set forth in claim 18, wherein act (b) comprises the act of disposing an amorphous tungsten nitride layer over the polysilicon layer.

20. The method, as set fort in claim 19, wherein act (c) comprises the act of forming a silicon nitride layer between the polysilicon layer and the amorphous tungsten nitride layer.

21. The method, as set forth in claim 20, wherein act (d) comprises the act of forming a crystallized tungsten nitride layer between the silicon nitride layer and the amorphous tungsten nitride layer.

22. The method, as set forth in claim 21, wherein act (e) comprises the act of annealing the wordline stack in an $Ar/H_2$ gas at a temperature of 900° C. for a time period of between about 40 seconds and about 120 seconds.

23. The method, as set forth in claim 21, wherein act (e) comprises the act of annealing the wordline stack in an $Ar/H_2$ gas at a temperature of 950° C. for a time period of greater than or equal to about 20 seconds.

24. The method, as set forth in claim 21, wherein act (e) comprises the acts of:
   annealing the wordline stack in an $Ar/H_2$ gas at a temperature of 900° C. for a time period of between about 40 seconds and about 120 seconds; and annealing the wordline stack in an Ar/H$_2$ gas at a temperature of 950° C. for a time period of greater than or equal to about 20 seconds.

25. The method, as set forth in claim 22, comprising the act of disposing a metal layer over the metal-nitride layer.

26. The method, as set forth in claim 25, comprising the act of disposing a nitride layer over the metal layer.

27. The method, as set forth in claim 22, comprising the act partially etching the wordline to the semiconductor layer before performing act (e).

28. The method, as set forth in claim 27, comprising the act of disposing one or more layers over the metal-nitride layer before the act of etching the wordline is performed.

29. The method, as set forth in claim 28, wherein the act of disposing one or more layers over the metal-nitride layer is performed before act (e) is performed.

30. A method of fabricating a wordline, comprising the acts of:

(a) disposing a semiconductor layer over a substrate;

(b) disposing a metal-nitride layer over the semiconductor layer;

(c) forming a first barrier layer between the semiconductor layer and the metal-nitride layer;

(d) forming a second barrier layer between the first barrier layer and the metal-nitride layer;

(e) disposing one or more additional layers over the metal-nitride layer;

(f) etching entirely through each of the one or more additional layers, the second barrier layer, the first barrier layer, and the metal-nitride layer, and partially through the semiconductor layer; and (g) annealing the substrate to essentially eliminate the second barrier layer.

31. The method, as set forth in claim 30, wherein act (a) comprises the act of disposing a polysilicon layer over the substrate.

32. The method, as set forth in claim 31, wherein act (b) comprises the act of disposing an amorphous tungsten-nitride layer over the polysilicon layer.

33. The method, as set fort in claim 32, wherein act (c) comprises the act of forming a silicon nitride layer between the polysilicon layer and the amorphous tungsten nitride layer.

34. The method, as set forth in claim 33, wherein act (d) comprises the act of forming a crystallized tungsten nitride layer between the silicon nitride layer and the amorphous tungsten nitride layer.

35. The method, as set forth in claim 34, wherein act (e) comprises the act of disposing a tungsten layer over the amorphous tungsten nitride layer.

36. The method, as set forth in claim 35, wherein act (e) comprises the act of disposing a nitride layer over the tungsten layer.

37. The method, as set forth in claim 36, wherein act (e) comprises the act of annealing the wordline stack in an Ar/H$_2$ gas at a temperature of 900° C. for a time period of between about 40 seconds and about 120 seconds.

38. The method, as set forth in claim 36, wherein act (g) comprises the act of annealing the wordline stack in an Ar/H$_2$ gas at a temperature of 950° C. for a time period greater than or equal to about 20 seconds.

39. The method, as set forth in claim 36, wherein act (e) comprises the acts of:

annealing the wordline stack in an Ar/H$_2$ gas at a temperature of 900° C. for a time period of between about 40 seconds and about 120 seconds; and annealing the wordline stack in an Ar/H$_2$ gas at a temperature of 950° C. for a time period of greater than or equal to about 20 seconds.

* * * * *

UNITED STATES PATENT AND TRADEMARK OFFICE
CERTIFICATE OF CORRECTION

PATENT NO. : 6,734,089 B1
DATED : May 11, 2004
INVENTOR(S) : Jongjun Jeff Hu, Satish Bedge and Kevin Torek It is certified that error appears in the above-identified patent and that said Letters Patent is hereby corrected as shown below:

Title page,
Item [73], Assignee, please add the following:
-- Assignee: Micron Technology, Inc. Boise, Idaho (US) --

Signed and Sealed this

Eighth Day of February, 2005

JON W. DUDAS
*Director of the United States Patent and Trademark Office*